(12) United States Patent
Jeong et al.

(10) Patent No.: US 11,639,945 B2
(45) Date of Patent: May 2, 2023

(54) TEST PROBE ASSEMBLY AND TEST SOCKET

(71) Applicant: LEENO INDUSTRIAL INC., Busan (KR)

(72) Inventors: Jae-hwan Jeong, Busan (KR); Geun-su Kim, Busan (KR); Jung-chul Shin, Changwon-si (KR)

(73) Assignee: LEENO INDUSTRIAL INC.

( * ) Notice: Subject to any disclaimer, the term of this patent is extended or adjusted under 35 U.S.C. 154(b) by 0 days.

(21) Appl. No.: 16/851,319

(22) Filed: Apr. 17, 2020

(65) Prior Publication Data

US 2020/0241042 A1    Jul. 30, 2020

Related U.S. Application Data

(63) Continuation of application No. PCT/KR2018/007343, filed on Jun. 28, 2018.

(30) Foreign Application Priority Data

Nov. 7, 2017  (KR) .......................... 10-2017-0147488
Jun. 14, 2018  (KR) .......................... 10-2018-0067907

(51) Int. Cl.
*G01R 1/067* (2006.01)
*G01R 1/18* (2006.01)
*G01R 3/00* (2006.01)

(52) U.S. Cl.
CPC ..... *G01R 1/06722* (2013.01); *G01R 1/06733* (2013.01); *G01R 1/06772* (2013.01); *G01R 1/18* (2013.01); *G01R 3/00* (2013.01)

(58) Field of Classification Search
CPC ............ G01R 1/06722; G01R 1/06733; G01R 1/06772; G01R 3/00
See application file for complete search history.

(56) References Cited

U.S. PATENT DOCUMENTS 6,037,787 A      3/2000  Corwith
6,053,777 A *   4/2000  Boyle ................ G01R 1/06722
                                                                    439/700

(Continued)

FOREIGN PATENT DOCUMENTS

CN        1292091 A      4/2001
CN      102971842 A      3/2013

(Continued)

OTHER PUBLICATIONS

Extended European Search Report (EP 18875791.8), EPO, dated Oct. 21, 2020.

(Continued)

*Primary Examiner* — Paresh Patel
(74) *Attorney, Agent, or Firm* — Park & Associates IP Law Office

(57) ABSTRACT

A test probe assembly includes: a conductive pipe; a probe inserted in the pipe without contacts and elastically retractable along a lengthwise direction; and an insulation probe supporting member configured to support the probe between an inner wall of the pipe and an outer surface of the probe. The test probe assembly of the present disclosure is improved in noise shield performance and convenient in repairing the probe since the probe is mounted to a probe socket as supported in a metal pipe without contacts.

10 Claims, 12 Drawing Sheets

(56) References Cited

U.S. PATENT DOCUMENTS

| | | | |
|---|---|---|---|
| 6,652,326 B2 * | 11/2003 | Boyle | G01R 1/06722 439/66 |
| 7,282,378 B2 | 10/2007 | Yoshida | |
| 2002/0013085 A1 | 1/2002 | Boyle et al. | |
| 2004/0212383 A1 * | 10/2004 | Yanagisawa | G01R 1/0441 324/754.08 |
| 2010/0311274 A1 | 12/2010 | Tan | |
| 2011/0050261 A1 | 3/2011 | Li et al. | |
| 2013/0099811 A1 | 4/2013 | Lee | |
| 2014/0058243 A1 | 2/2014 | Lin et al. | |
| 2014/0203831 A1 | 7/2014 | Lee | |
| 2017/0248630 A1 | 8/2017 | Yamamoto et al. | |

FOREIGN PATENT DOCUMENTS

| | | | |
|---|---|---|---|
| CN | 103765227 A | 4/2014 | |
| EP | 1060398 A1 | 12/2000 | |
| EP | 1471358 A2 | 10/2004 | |
| EP | 1607749 A2 | 12/2005 | |
| JP | 6082271 U | 6/1985 | |
| JP | 60207343 A | 10/1985 | |
| JP | S61-12071 U | 1/1986 | |
| JP | 06216205 A | 8/1994 | |
| JP | 2001033482 A | 2/2001 | |
| JP | 2001-284419 A | 10/2001 | |
| JP | 2002-501289 A | 1/2002 | |
| JP | 2004053343 A | 2/2004 | |
| JP | 2004-101327 A | 4/2004 | |
| JP | 2005-049163 A | 2/2005 | |
| JP | 2005-249447 A | 9/2005 | |
| JP | 2006-125988 A | 5/2006 | |
| JP | 2010-197402 A | 9/2010 | |
| JP | 2011-506925 A | 3/2011 | |
| KR | 10-2004-0045620 A | 6/2004 | |
| KR | 10-2004-0093023 A | 11/2004 | |
| KR | 10-2004-0093040 A | 11/2004 | |
| KR | 10-2006-0052285 A | 5/2006 | |
| KR | 10-2010-0010780 A | 2/2010 | |
| KR | 10-2010-0105622 A | 9/2010 | |
| KR | 10-2011-0045890 A | 5/2011 | |
| KR | 10-2013-0024780 A | 3/2013 | |
| KR | 10-1331525 B1 | 11/2013 | |
| KR | 10-1534778 B1 | 7/2015 | |
| KR | 10-2017-0033262 A | 3/2017 | |
| TW | 200813437 A | 3/2008 | |
| TW | 201312122 A | 3/2013 | |
| TW | 201312122 A1 * | 3/2013 | G01R 1/06722 |
| TW | 201546458 A | 12/2015 | |
| TW | 201734469 A | 10/2017 | |
| WO | 2017064927 A1 | 4/2017 | |
| WO | 2017082510 A1 | 5/2017 | |

OTHER PUBLICATIONS

Korean Office Action (KR 10-2018-0038134), KIPO, dated Aug. 9, 2018.
International Search Report (PCT/KR2018/007343), WIPO, dated Oct. 19, 2018.
Korean Notice of Allowance (KR 10-2018-0038134), KIPO, dated Nov. 23, 2018.
Korean Office Action (KR 10-2018-0067907), KIPO, dated Apr. 9, 2019.
Korean Notice of Allowance (KR 10-2018-0067907), KIPO, dated Dec. 17, 2019.
Taiwan Office Action with Search Report (TW 107122388), TIPO, dated Feb. 22, 2019.
Korean Office Action (KR 10-2019-0067891), KIPO, dated Jun. 26, 2019.
Taiwan Notice of Allowance (TW107122388), TIPO, dated Jul. 16, 2019.
Korean Notice of Allowance (KR 10-2019-0067891), KIPO, dated Oct. 29, 2019.
Japanese Office Action (JP 2020-541329), JPO, dated Apr. 27, 2021.
Chinese Office Action (CN 201880068269.X), CNIPA, dated Sep. 30, 2021.
Japanese Office Action (JP 2020-541329), JPO, dated Dec. 7, 2021.

* cited by examiner

TEST PROBE ASSEMBLY AND TEST SOCKET

REFERENCE TO RELATED APPLICATIONS

This is a continuation of pending International Patent Application PCT/KR2018/007343 filed on Jun. 28, 2018, which designates the United States and claims priority of Korean Patent Application No. 10-2017-0147488 filed on Nov. 7, 2017, and Korean Patent Application No. 10-2018-0067907 filed on Jun. 14, 2018, the entire contents of which are incorporated herein by reference.

FIELD OF THE INVENTION

The present disclosure relates to a test probe assembly and a test socket for testing a radio-frequency or high-speed semiconductor or the like object to be tested.

BACKGROUND OF THE INVENTION

In a test socket for testing a radio-frequency or high-speed semiconductor, a signal probe is mounted to a conductive block without contact for a shield against noise from an adjacent signal probe. In this case, the signal probe includes opposite end portions supported on insulation support plates arranged on both sides of the conductive block after the signal probe passes through the conductive block without contact. However, it is difficult for such a convention method to support the probes when the insulation support plate is not thick enough to support the probes. On the other hand, when the insulation support plate is thick, the support plate causes a problem of noise leakage between the signal probes.

To solve such a problem, a related art of Korean patent publication No. 10-2010-0105622 has disclosed that an epoxy insulator is arranged at opposite ends of a probe hole in a conductive test socket and supports a signal probe. A lot of test probes are mounted to the test socket. Such a conventional method has a problem that the whole test socket has to be replaced even when only one test probe is damaged among the test probes mounted to the test socket. Further, the conventional method has a problem that it is very inconvenient and hard to insert the epoxy insulator in the probe hole of the test socket. In particular, the conventional method has a problem that the epoxy insulator inserted in the probe hole of the test socket is not easily supported and thus sticks out.

SUMMARY OF THE INVENTION

An object of the present disclosure is conceived to solve a conventional problem and provide a test probe assembly for testing a radio-frequency or high-speed semiconductor and a test socket, which improves a shield against noise and is convenient in repair and maintenance.

Another object of the present disclosure is to provide a test probe assembly for testing a radio-frequency or high-speed semiconductor and a test socket, which is easily manufactured and has excellent durability.

In accordance with an embodiment of the present disclosure, a test probe assembly and a test socket are provided to solve the foregoing problems. The test probe assembly includes: a conductive pipe; a probe inserted in the pipe without contacts and elastically retractable along a lengthwise direction; and an insulation probe supporting member configured to support the probe between an inner wall of the pipe and an outer surface of the probe.

The probe supporting member may be previously manufactured before to be inserted in the pipe, and includes a projection accommodator, which accommodates a projection formed by inwardly pressing the pipe.

The probe supporting member may be formed by injecting and hardening liquid epoxy in the pipe.

The pipe may include first and second pipes longitudinally connected to each other.

The probe supporting member may include a pipe insertion portion, an extended portion radially extended from the pipe insertion portion, and a first screw formed on an outer surface of the pipe insertion portion, and the pipe may include a second screw corresponding to the first screw.

The probe may include a barrel and a plunger inserted in the barrel while partially protruding from the barrel, and the probe supporting member may include a barrel hole to accommodate the barrel and a plunger hole to accommodate the plunger.

The projection accommodator may be formed on an outer circumferential surface of the plunger hole.

At least one of both end portions of the pipe may include a puckered portion reduced in diameter.

A test socket include: the foregoing test probe assembly; and a conductive block configured to support the test probe assemblies in parallel so that the both end portions of the probe can partially protrude from the top and bottom surfaces of the conductive block.

A method of manufacturing a test probe assembly, includes: forming a projection, which protrudes inwardly by rolling or dimpling work, at one end portion of the pipe; mounting a pipe to a tray; inserting a mold having a shape similar to an outer appearance of a probe, into one side of the pipe; covering the other side of the pipe with a cover plate having a resin injection hole; injecting resin through the resin injection hole and hardening the resin; and removing the mold and the cover plate.

The test probe assembly and the test socket according to the present disclosure have advantages as follows.

First, the probe hole is covered with the metal pipe as much as possible, thereby minimizing exposure between the signal probes and improving noise-shield performance.

Second, only a damaged test probe assembly is replaceable in the test socket, thereby reducing repair costs.

Third, the probe supporting member is firmly supported in the metal pipe, thereby improving durability.

Fourth, it is easy to manufacture the test probe assembly for a shield against noise.

DETAILED DESCRIPTION OF THE INVENTION

Below, a test probe assembly 100 according to embodiments of the present disclosure will be described with reference to accompanying drawings.

Figure 1:
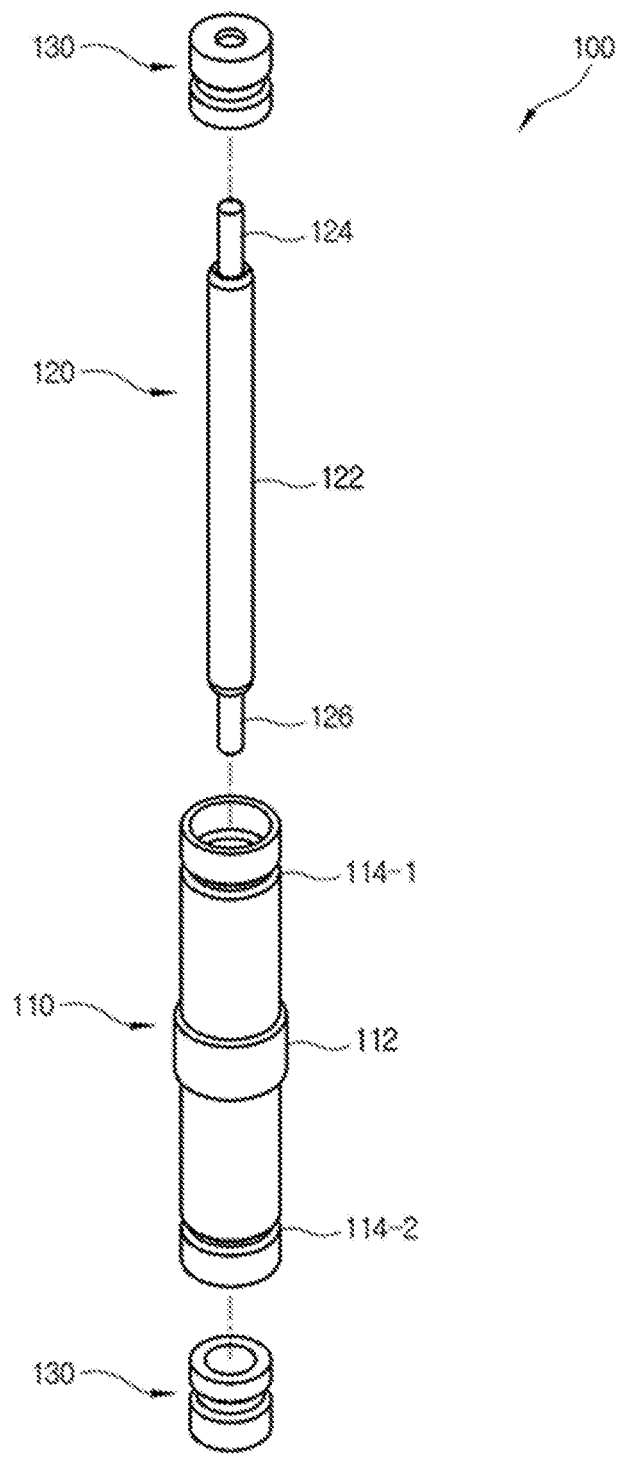
FIGS. 1 and 2 are respectively a perspective view and a cross-section view of a test probe assembly according to a first embodiment of the present disclosure.
Figure 2:
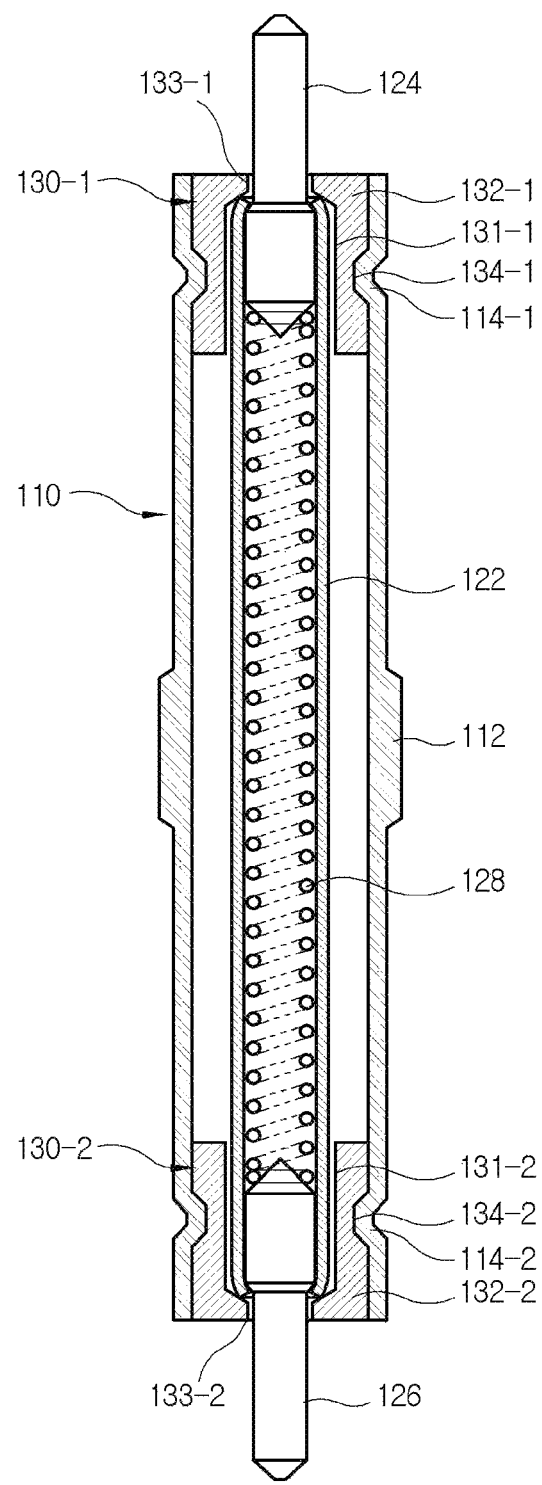

FIGS. 1 and 2 are respectively a perspective view and a cross-section view of a test probe assembly 100 according to a first embodiment of the present disclosure. As shown therein, the test probe assembly 100 includes a conductive pipe 110, a probe 120 accommodated in the pipe 110, and an insulation probe supporting member 130 supporting the probe 120 in the pipe 110.

The conductive pipe 110 is manufactured as a hollow pipe made of metal, for example, iron, copper, aluminum, beryllium copper, or alloy thereof, or the like. The conductive pipe 110 includes a flange 112 radially extended in a middle of an outer surface thereof, and first and second projections 114-1 and 114-2 circumferentially protruding inward by rolling work at opposite ends thereof. The first and second projections 114-1 and 114-2 are respectively accommodated in first and second projection accommodator 134-1 and 134-2 of the probe supporting member 130 to be described later. Here, the rolling work is carried out with the probe supporting member 130 inserted into the pipe 110. In result, the probe supporting member 130 is firmly fastened in the conductive pipe 110. The flange 112 prevents the test probe assembly 100 from sticking out when the test probe assembly 100 is mounted to a test socket 1 to be described later. Alternatively, a dot-shaped projection may be formed by dimpling work instead of the circumferential projection formed by the rolling work.

The probe 120 may be achieved by a pogo pin retractable in a lengthwise direction. The probe 120 includes a barrel 122, first and second plungers 124 and 126 inserted in opposite ends of the barrel 122 and retractable in the lengthwise direction, and an elastic body, for example, a spring 128 allowing the first and second plungers 124 and 126 to be elastically retractable within the barrel 122. One of the first and second plungers 124 and 126 may be selectively fixed to the barrel 122. The probe 120 is supported by the probe supporting member 130 without contacting the inner wall of the pipe 110. The first and second plungers 124 and 126 basically protrude from the ends of the pipe 110, and moves into the barrel 122 for a test while compressing the spring 128. The foregoing structure of the probe 120 is merely given by way of example for descriptions. Besides, the probe may have various structures.

The probe supporting member 130 supports the probe 120 not to contact the inner wall of the pipe 110. The probe supporting member 130 includes a first probe supporting member 130-1 placed at one end of the pipe 110, and a second probe supporting member 130-2 placed at the other end of the pipe 110. The first and second probe supporting members 130-1 and 130-2 are configured to support both ends of the barrel 122 of the probe 120 to float in the pipe 110. The probe supporting member 130 may be processed or molded by an insulation material, for example, epoxy or engineering plastic.

The first and second probe supporting members 130-1 and 130-2 respectively include first and second barrel holes 131-1 and 131-2 corresponding to the outer diameter of the barrel 122 of the probe 120, and first and second plunger holes 133-1 and 133-2 corresponding to the outer diameter of the first and second plungers 124 and 126.

The first and second probe supporting members 130-1 and 130-2 respectively include first and second pipe insertion portions 132-1 and 132-2 to be inserted at opposite ends in the pipe 110, and the first and second projection accommodators 134-1 and 134-2 formed on the outer circumferential surface of the first and second pipe insertion portions 132-1 and 132-2. The first and second projection accommodators 134-1 and 134-2 are configured to accommodate the first and second projections 114-1 and 114-2 formed inward by applying the inward rolling or dimpling work to the pipe 110 in the state that the first and second pipe insertion portions 132-1 and 132-2 are inserted in the pipe 110, thereby holding the inserted first and second probe supporting members 130-1 and 130-2 not to stick out of the pipe 110. As necessary, the first and second projections 114-1 and 114-2 formed by the rolling or dimpling work may directly and forcibly deform the first and second probe supporting members 130-1 and 130-2 without previously forming the first and second projection accommodators 134-1 and 134-2.

Figure 7:
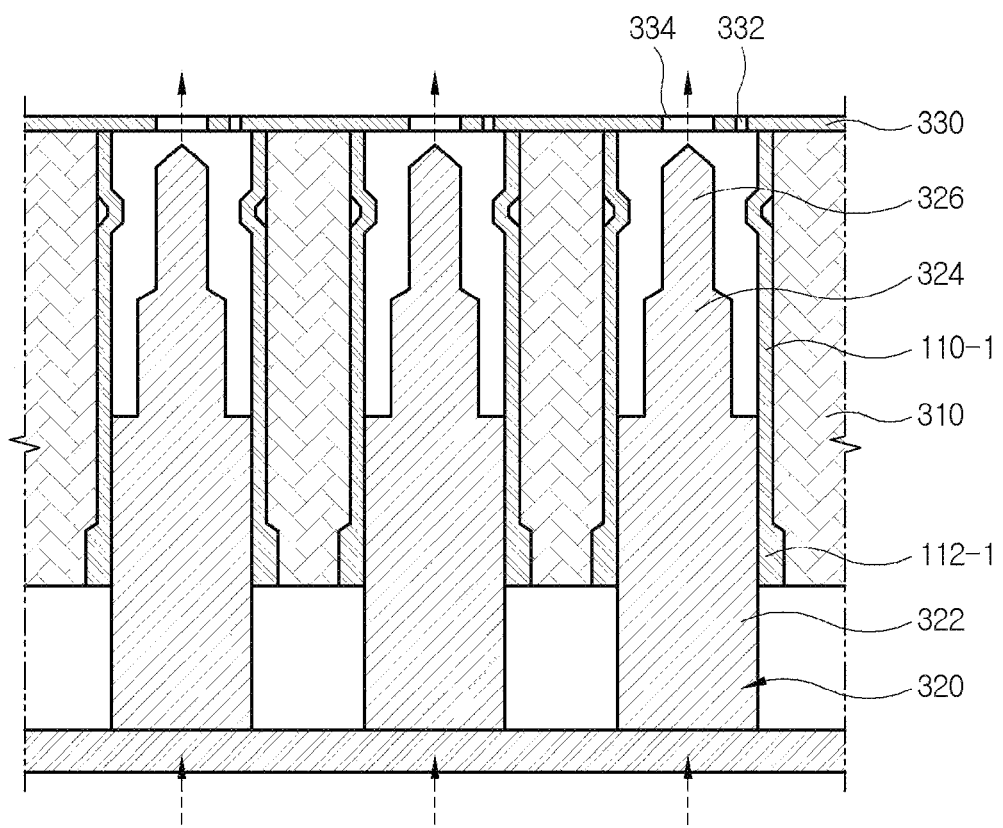
FIGS. 7 and 8 are views of illustrating a process of manufacturing the test probe assembly according to the first embodiment of the present disclosure.
Figure 8:
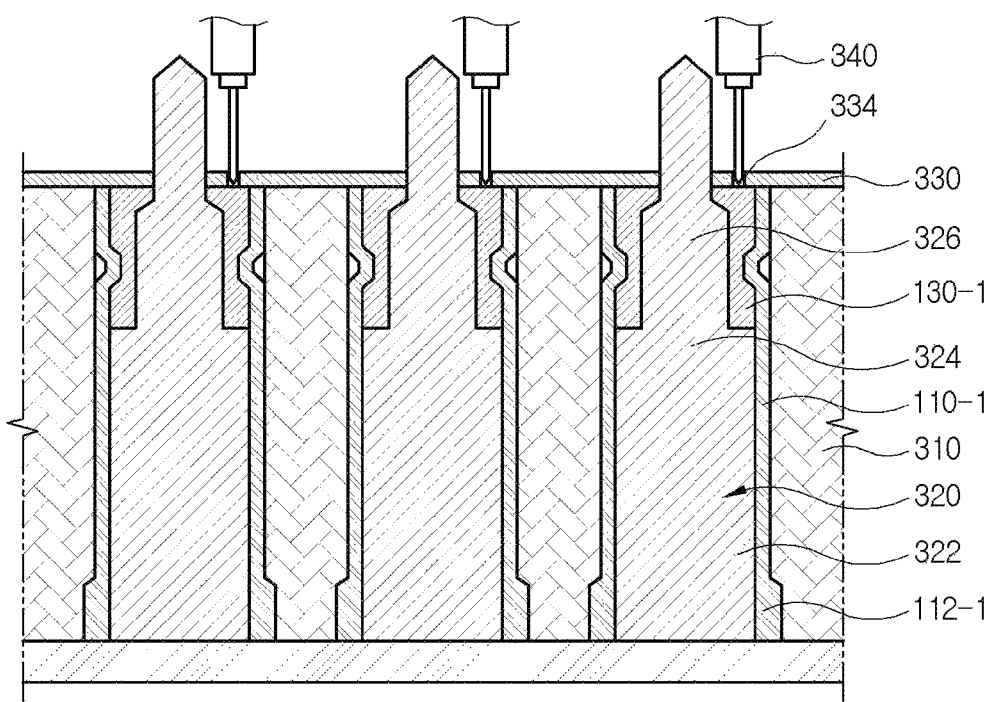

The first and second probe supporting members 132-1 and 132-2 may be formed by injecting and hardening liquid epoxy in the pipe 110 as shown in FIGS. 7 and 8, instead of the first and second probe supporting members 132-1 and 132-2 previously manufactured and then inserted in the pipe 110.

Figure 3:
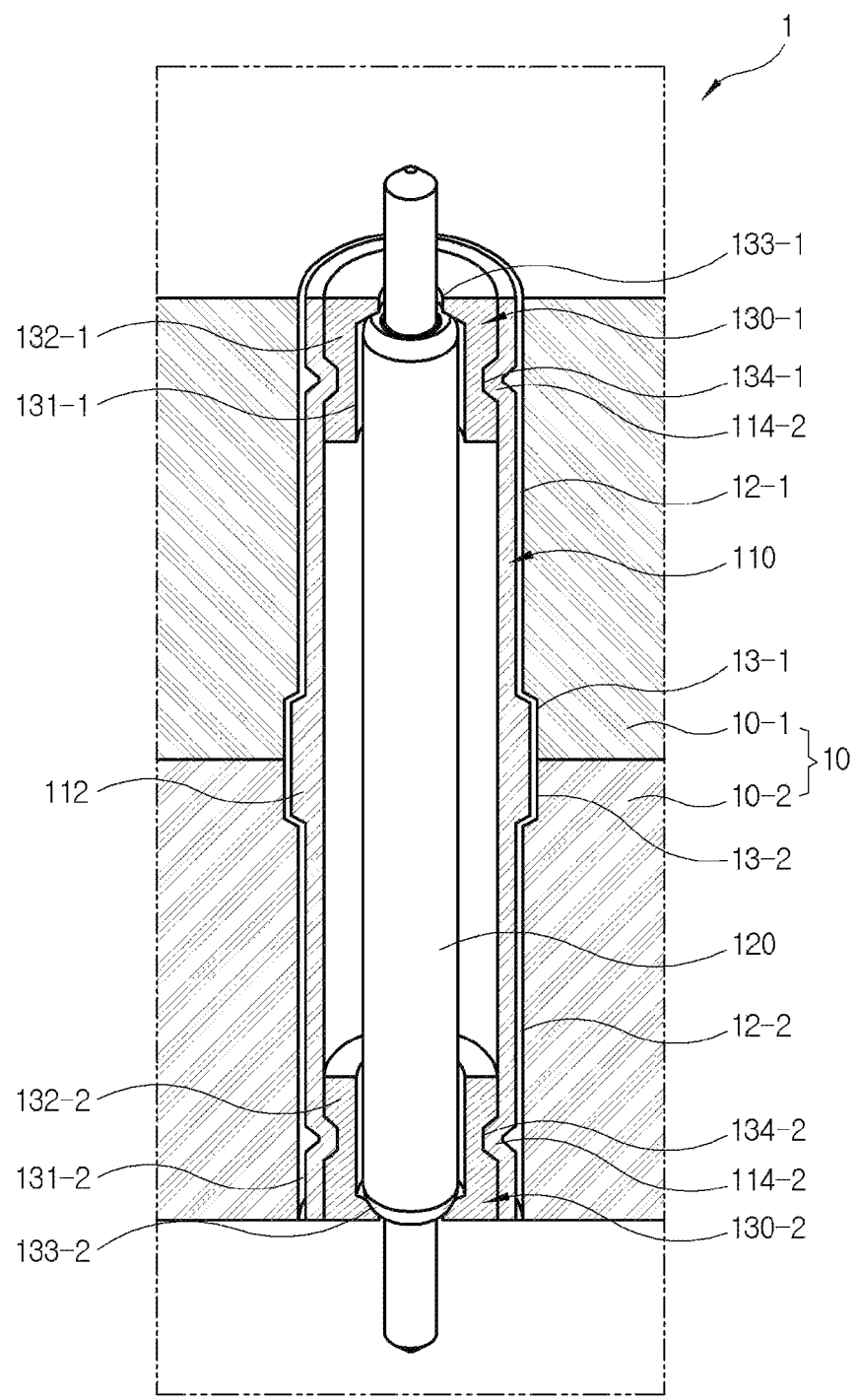
FIG. 3 is a partial cross-section view of a test socket mounted with the test probe assembly of FIG. 1, FIGS. 4 and 5 are cross-section views of test sockets to which test probe assemblies according to second and third embodiments of the present disclosure are applied, respectively.

FIG. 3 is a partial cross-section view of a test socket 1 mounted with the test probe assembly 100 of FIGS. 1 and 2. As shown therein, the test socket 1 includes a conductive block 10 and at least one test probe assembly 100.

The conductive block 10 is manufactured using a metal block containing silver, iron, copper, brass or the like, or a plating block produced by plating plastic, ceramic or the like with, for example, gold. The conductive block 10 includes a probe hole 12 in which the test probe assembly 100 is inserted and mounted as a signal probe. The conductive block 10 includes a first block 10-1 and a second block 10-2. The first block 10-1 includes a first pipe hole 12-1 corresponding to the outer diameter of the pipe 110, and a first flange hole 13-1 correspond to half of the flange 112 of the pipe 110. The second block 10-2 includes a second pipe hole 12-2 corresponding to the outer diameter of the pipe 110, and a second flange hole 13-2 corresponding to the other half of the flange 112 of the pipe 110. As the flange 112 is inserted in and fastened to the first and second flange holes 13-1 and 13-2 of the first and second blocks 10-1 and 10-2, the test probe assembly 100 is firmly fastened and supported in the conductive block 10.

As shown in FIG. 3, the pipe 110 of the test probe assembly 100 is filled in the test socket 1 throughout the thickness of the test socket 1, thereby preventing noise interference between adjacent test probe assemblies 100 as much as possible. Further, when a certain test probe assembly 100 has a failure or breaks downs, only the corresponding test probe assembly 100 is replaceable. That is, the insulation supporting members which is mounted to top and bottom surfaces of the conductive block so as to support the probe is excluded according to the first embodiment of the present disclosure.

Figure 4:
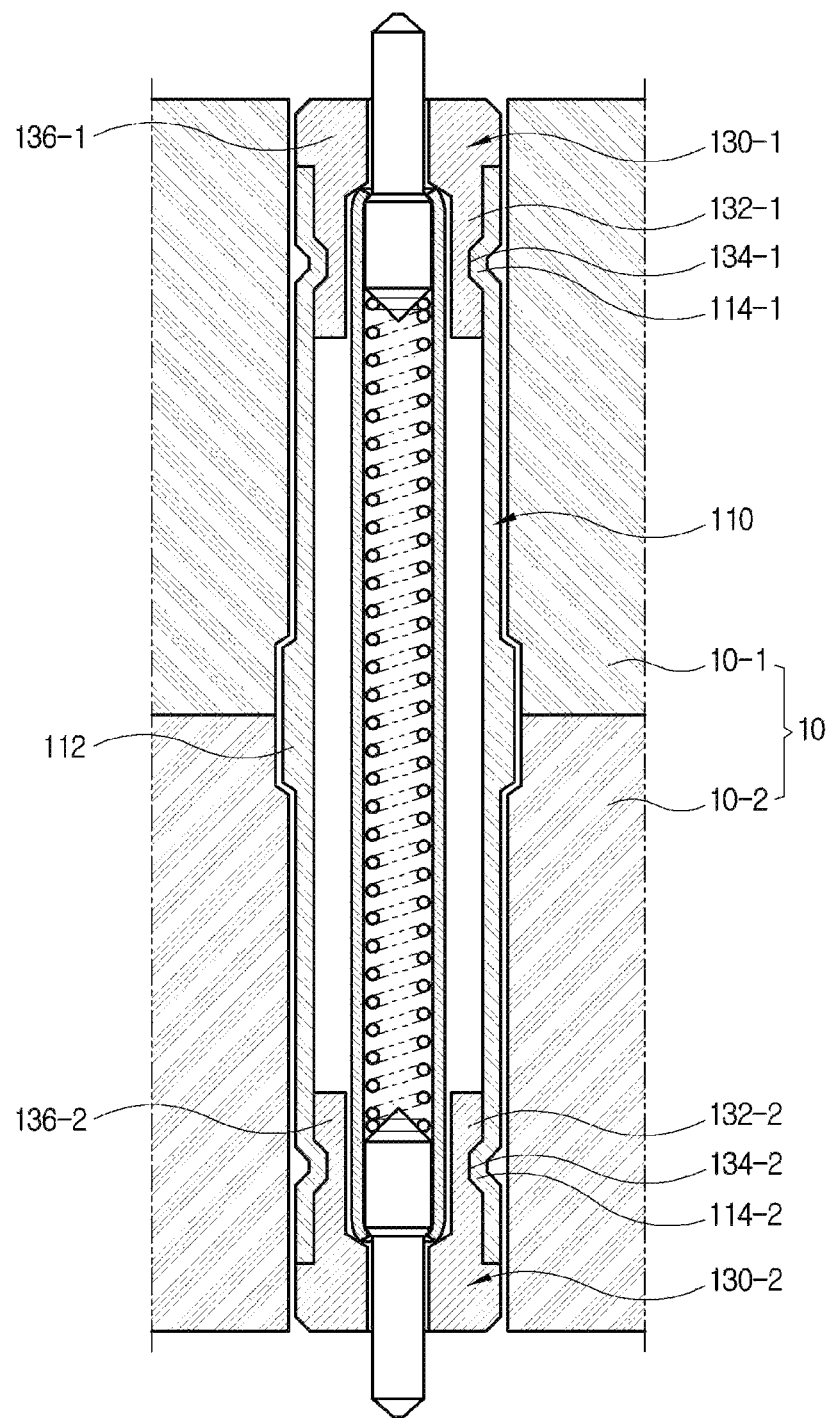
Figure 5:
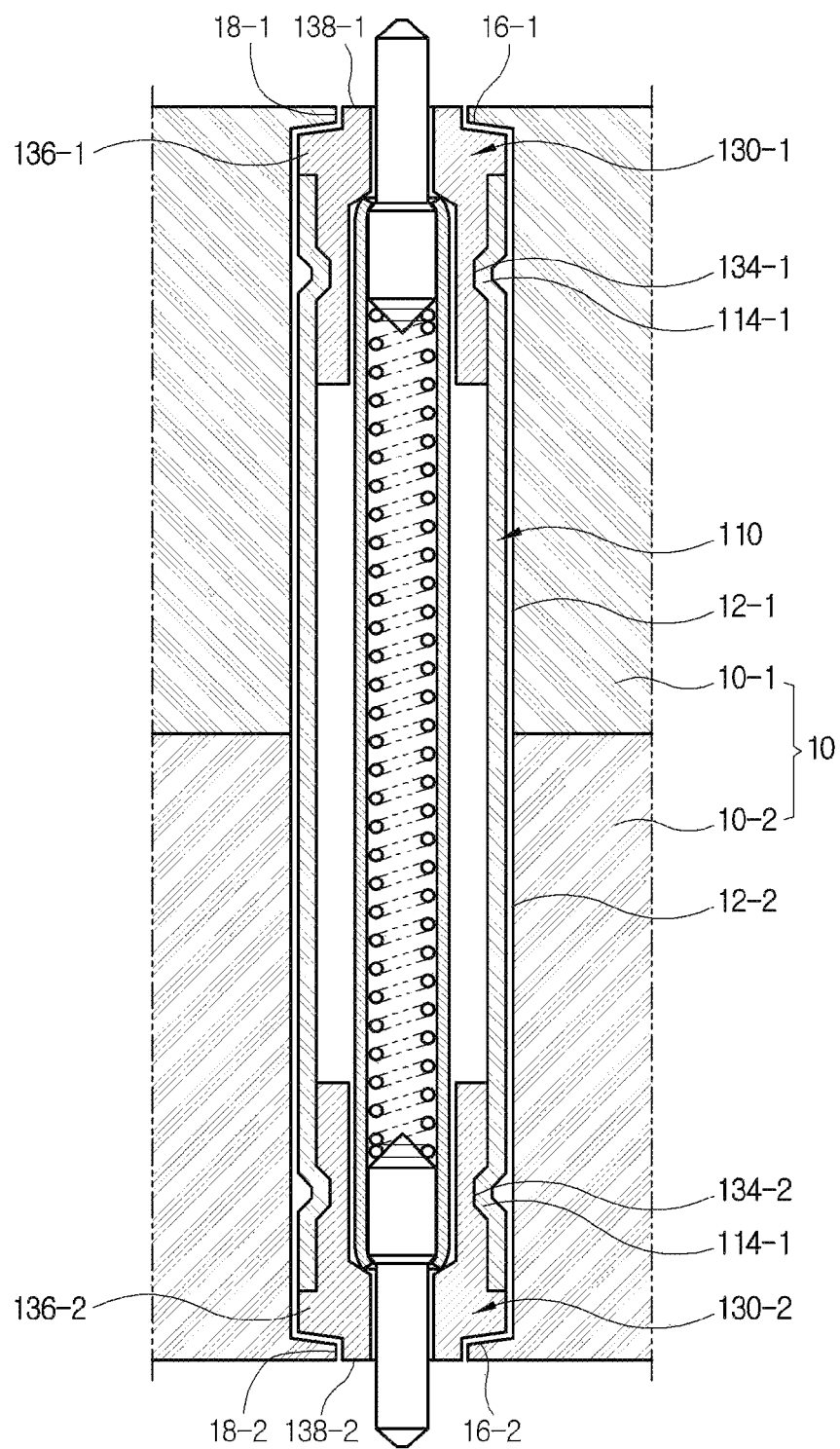

FIGS. 4 and 5 are cross-section views of test sockets 1 to which test probe assemblies 100 according to second and third embodiments of the present disclosure are applied, respectively. In these embodiments, the same portions as those of the first embodiment shown in FIGS. 1 to 3 are denoted by the same numerals, and repetitive descriptions thereof are avoided.

In FIG. 4, the first and second probe supporting members 130-1 and 130-2 respectively include the first and second pipe insertion portions 132-1 and 132-2 to be inserted in the pipe 110; the first and second projection accommodators 134-1 and 134-2 formed on the outer circumferential surfaces of the first and second pipe insertion portions 132-1 and 132-2; and first and second extended portions 136-1 and 136-2 radially extended from the first and second pipe insertion portions 132-1 and 132-2 toward the outsides of the end portions of the pipe 110. The first and second projection accommodators 134-1 and 134-2 are configured to accommodate the first and second projections 114-1 and 114-2 formed by the inward rolling or dimpling work of the pipe 110 in the state that the first and second pipe insertion portions 132-1 and 132-2 are inserted in the pipe 110. The first and second extended portions 136-1 and 136-2 are suitable in the case where the probe supporting member 130 is previously manufactured and then inserted in the pipe 110. In particular, the probe supporting member 130 is so small in diameter (about 1 mm) that it is very difficult to insert the pipe 110 therein, thereby requiring a proper grip such as the first and second extended portions 136-1 and 136-2.

In FIG. 5, the conductive pipe 110 includes the first and second projections 114-1 and 114-2 deformed by the inward rolling or dimpling work. The conductive pipe 110 excludes the flange 112 unlike that of the first and second embodiments.

The first and second probe supporting members 130-1 and 130-2 respectively include the first and second pipe insertion portion 132-1 and 132-2 inserted in each pipe 110; the first and second projection accommodators 134-1 and 134-2 formed on the outer surfaces of the first and second pipe insertion portion 132-1 and 132-2; the first and second extended portions 136-1 and 136-2 radially extended from the first and second pipe insertion portions 132-1 and 132-2 toward the outer ends of the pipe 110; and first and second transaxial portions 138-1 and 138-2 radially reduced and extended from the extended portions 136-1 and 136-2. The first and second projection accommodators 134-1 and 134-2 are configured to accommodate the first and second projections 114-1 and 114-2 deformed by the inward rolling or dimpling work of the pipe 110 in the state that the first and second pipe insertion portions 132-1 and 132-2 are inserted in the pipe 110. The first and second extended portions 136-1 and 136-2 are suitable in the case where the probe supporting member 130 is previously manufactured and then inserted in the pipe 110. In particular, the probe supporting member 130 is so small in diameter (about 1 mm) that it is very difficult to insert the pipe 110 therein, thereby requiring a proper grip such as the first and second extended portions 136-1 and 136-2.

The conductive block 10 includes the probe hole 12 in which the test assembly 100 is inserted and mounted as a signal probe. The conductive block 10 includes an upper block 10-1 and a lower block 10-2. The upper block 10-1 includes an upper pipe hole 12-1 corresponding to the outer diameter of the pipe 110, and a first transaxial portion insertion hole 16-1 corresponding to the outer diameter of the first transaxial portion 138-1. The lower block 10-2 includes a lower pipe hole 1202 corresponding to the outer diameter of the pipe 110, and a second transaxial portion insertion hole 16-2 corresponding to the outer diameter of the second transaxial portion 138-2. The conductive block 10 includes a first stepped portion 18-1 between the upper pipe hole 12-1 and the first transaxial portion insertion hole 16-1, and a second stepped portion 18-2 between the lower pipe hole 12-2 and the second transaxial portion insertion hole 16-2. Here, the conductive block 10 excludes the upper flange hole 13-1 and the lower flange hole 13-2 unlike that of the first and second embodiments. Instead, the test probe assembly 100 is held and supported within the conductive block 10 by the first and second stepped portions 18-1 and 18-2 of the conductive block 10.

Figure 6:
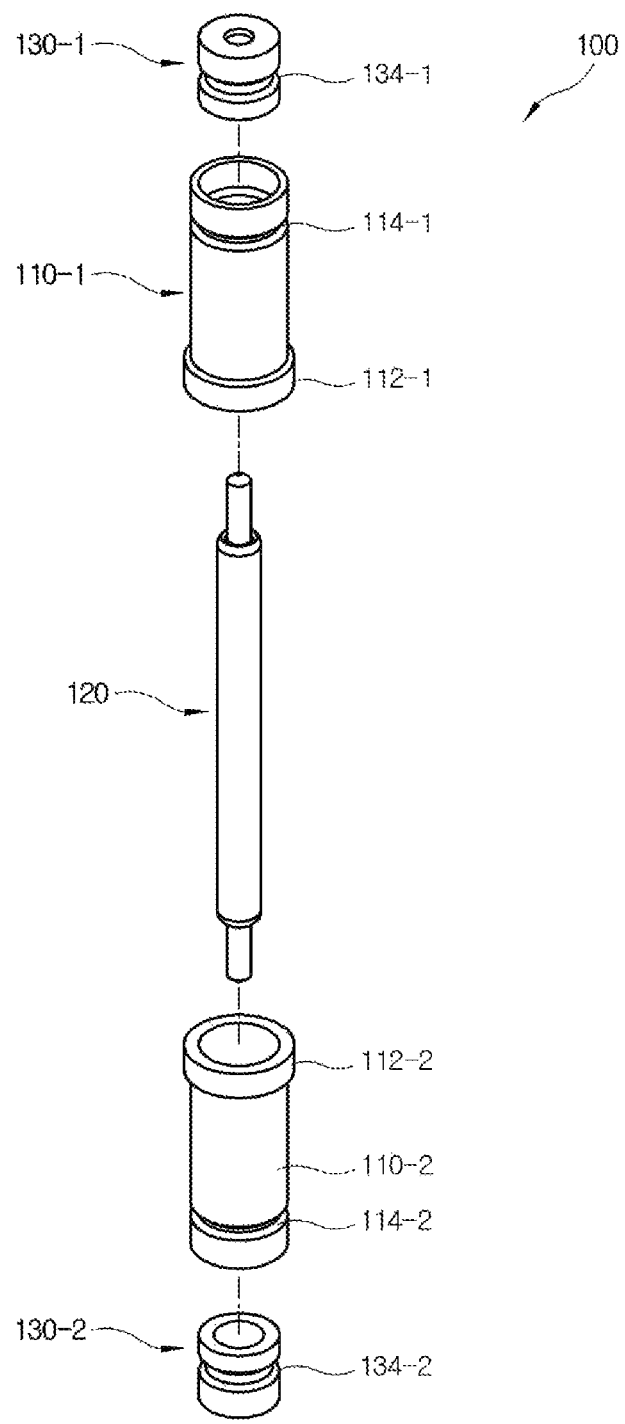
FIG. 6 is an exploded perspective view of a test probe assembly according to a fourth embodiment of the present disclosure.

FIG. 6 is an exploded perspective view of a test probe assembly 100 according to a fourth embodiment of the present disclosure. The test probe assembly 100 includes a conductive first pipe 110-1; a conductive second pipe 110-2; a probe 120 retractable up and down within the first and second pipes 110-1 and 110-2; and insulation first and second probe supporting members 130-1 and 130-2 for supporting the probe 120 within the first and second pipes 110-1 and 110-2. In this test probe assembly 100, the probe 120 and the first and second probe supporting members 130-1 and 130-2 except the first and second pipes 110-1 and 110-2 have the same structure as the probe 120 and the first and second probe supporting members of the first embodiment shown in FIGS. 1 to 3, and thus repetitive descriptions thereof will be avoided.

The first pipe 110-1 includes a first flange 112-1 radially extended at one end thereof, and a first projection 114-1 protruding inward from a pipe wall by rolling or dimpling work or the like. The first probe supporting member 130-1 is inserted in the first pipe 110-1 at one end portion thereof. The second pipe 110-2 includes a second flange 112-2 radially extended at one end thereof, and a second projection 114-2 protruding inward from a pipe wall by rolling or dimpling work or the like. The second probe supporting member 130-2 is inserted in the second pipe 110-2 at one end portion thereof. The first pipe 210-1 and the second pipe 210-2 are configured to accommodate and support the probe 120 as the first flange 212-1 and the second flange 212-2 are connected to be in contact with each other.

FIGS. 7 and 8 are views of illustrating a process of forming the first probe supporting member 130-1 in the first pipe 110-1 of FIG. 6. Here, this process is equal to a process of forming the second probe supporting member 130-1 in the second pipe 110-2, and thus repetitive descriptions thereof will be avoided.

In FIG. 7, the first pipe 110-1 is mounted to a mold 320 while making the first flanges 112-1 face downward in a plurality of trays 310. The mold 320 is shaped like an outer appearance of the probe 120 to be inserted in the first pipe 110-1, and approximately includes a base 322 corresponding to an inner diameter of the first pipe 110-1, a first transaxial portion 324 corresponding to an outer diameter of the barrel 122 of the probe 120, and a second transaxial portion 326 corresponding to an outer diameter of the first plunger 124 of the probe 120. Then, a cover plate 330 moves down from above the tray 310 to cover the end portion of the first pipe 110-1. The cover plate 330 includes an open hole 332 in which the second transaxial portion 326 is inserted, and a resin injection hole 334. The resin injected through the resin injection hole 334 includes liquid epoxy.

In FIG. 8, the liquid epoxy injected into the resin injection hole 332 by a resin injector 340 is hardened to thereby form the first probe supporting member 130-1. Then, the first pipe 110-1 with the inserted first probe supporting member 130-1 is formed as shown in FIG. 3 when the mold 320 is pulled out. The first probe supporting member 130-1 is firmly fastened within a first pipe 210-1 by a first projection 214-1. By this method, mass production of the first pipe 110-1 with the inserted first probe supporting member 130-1 having a very small size is possible.

Figure 9:
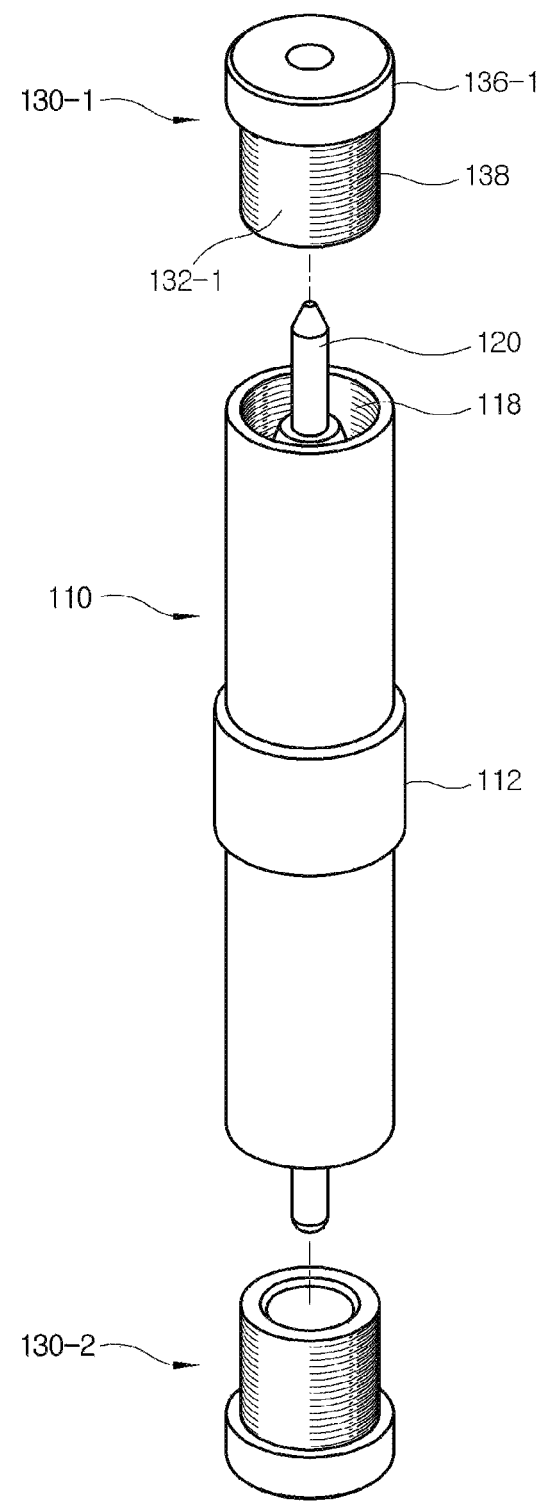
FIGS. 9 and 10 are views of illustrating probe supporting member according to fifth and sixth embodiments of the present disclosure, respectively.

FIG. 9 illustrates a test probe assembly 100 according to a fifth embodiment of the present disclosure. The same numerals refer to the same elements as those of the first embodiment shown in FIGS. 1 to 3, and descriptions thereof will be omitted.

A conductive pipe 110 includes a flange 112 in the middle thereof, and a first screw 118 internally formed at each of the opposite end portions thereof. Here, the first screw 118 may be directly formed on the wall of the pipe 110 since the pipe 110 is not only very small but also thin.

A first probe supporting member 130-1 includes a first pipe insertion portion 132-1 to be inserted in the conductive pipe 110, a first extended portion 136-1 radially extended from the first pipe insertion portion 132-1, and a second screw 138-1 formed on the outer circumferential surface of the first pipe insertion portion 132-1.

In FIG. 9, the first screw 118 of the pipe 110 is fastened with the second screw 138 of the first probe supporting member 130-1, and thus the first probe supporting member 130-1 is easily fastened to the end portion of the pipe 110.

Figure 10:
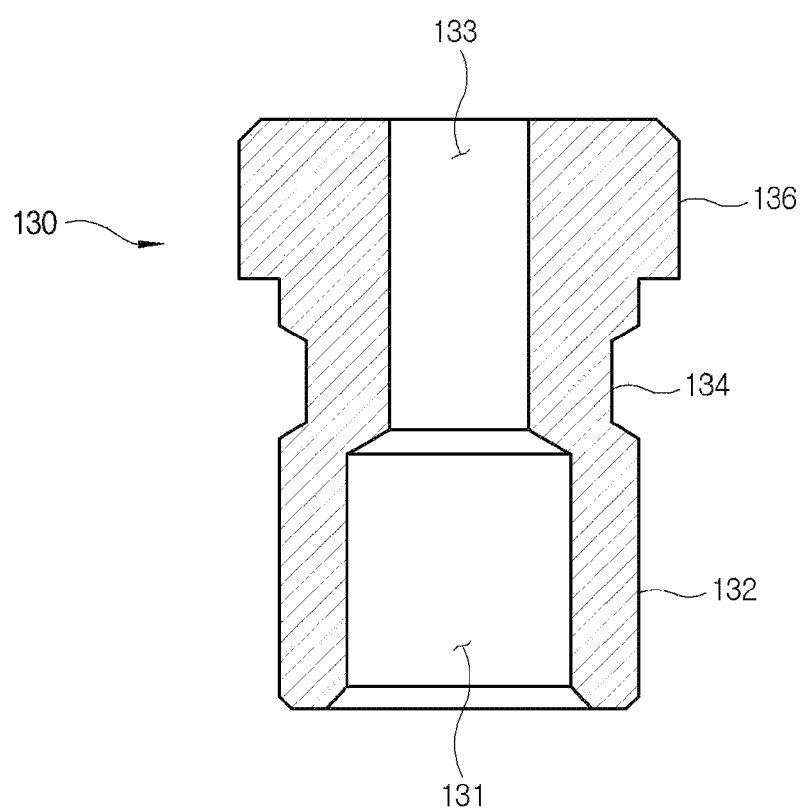

FIG. 10 illustrates a probe supporting member 130 of a test probe assembly 100 according to a sixth embodiment of the present disclosure.

A probe supporting member 130 includes a pipe insertion portion 132 to be inserted in the pipe 110 at opposite end portions thereof, a projection accommodator 134 formed on an outer circumferential surface of the pipe insertion portion 132, and a flange 136 radially extended from the pipe insertion portion 132.

The probe supporting member 130 includes a barrel hole 131 corresponding to an outer diameter of a barrel 122 of the probe 120, and a plunger hole 133 corresponding to outer diameters of plungers 124 and 126.

In FIG. 10, the plunger hole 133 passes by a flange 136 and deeply extended up to the pipe insertion portion 132. In this case, the projection accommodator 134 is formed in the pipe insertion portion 132 at a position to surround the plunger hole 133. Since the pipe insertion portion 132 surrounding the plunger hole 133 is thicker than the pipe insertion portion 132 surrounding the barrel hole 131, it is easy to form a projection accommodator 134. Further, it is more durable when the projection accommodator 134 is formed in the pipe insertion portion 132 surrounding the plunger hole 133 rather than the pipe insertion portion 132 around the barrel hole 131.

Figure 11:
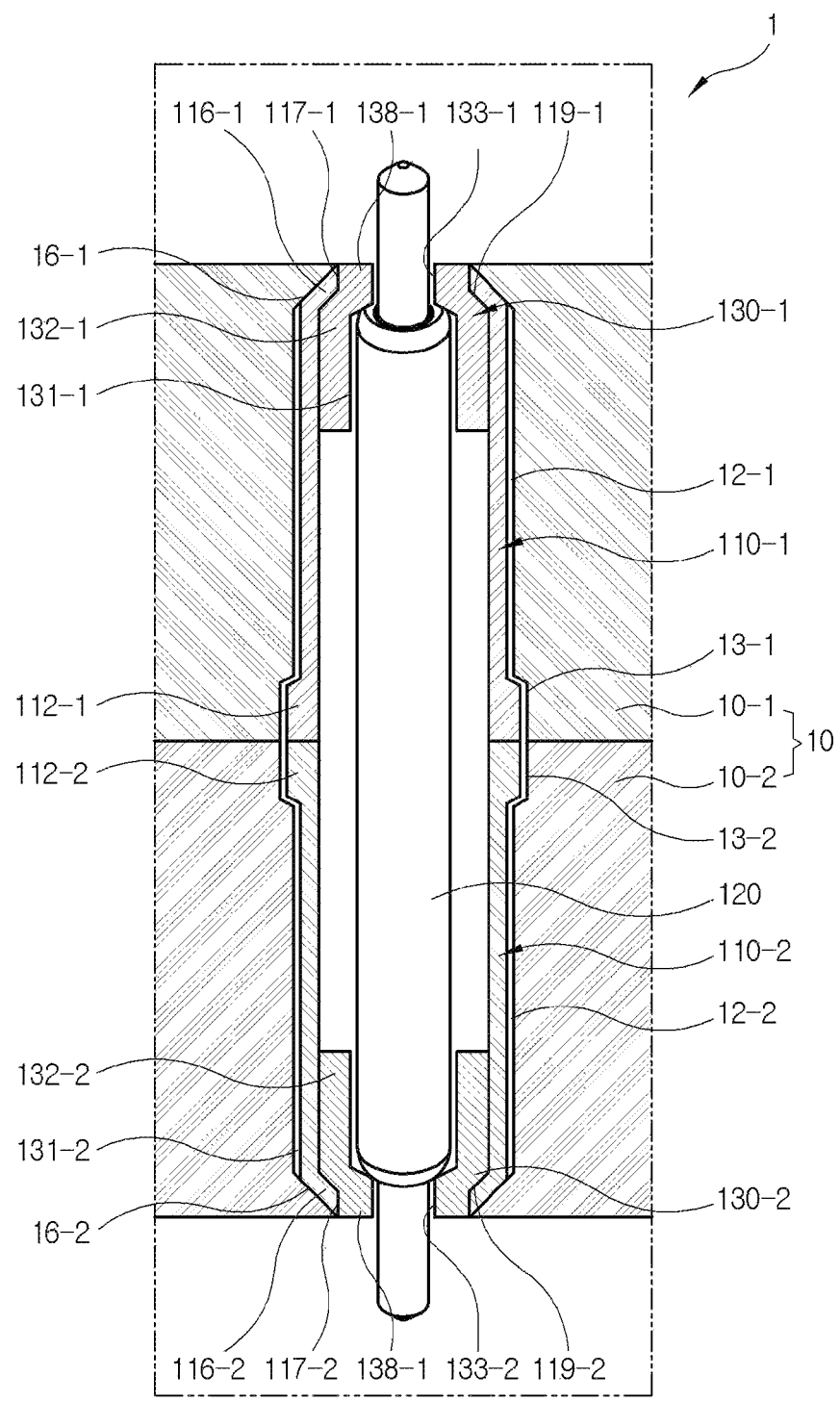
FIG. 11 is an exploded perspective view of a test probe assembly according to a seventh embodiment of the present disclosure.
Figure 12:
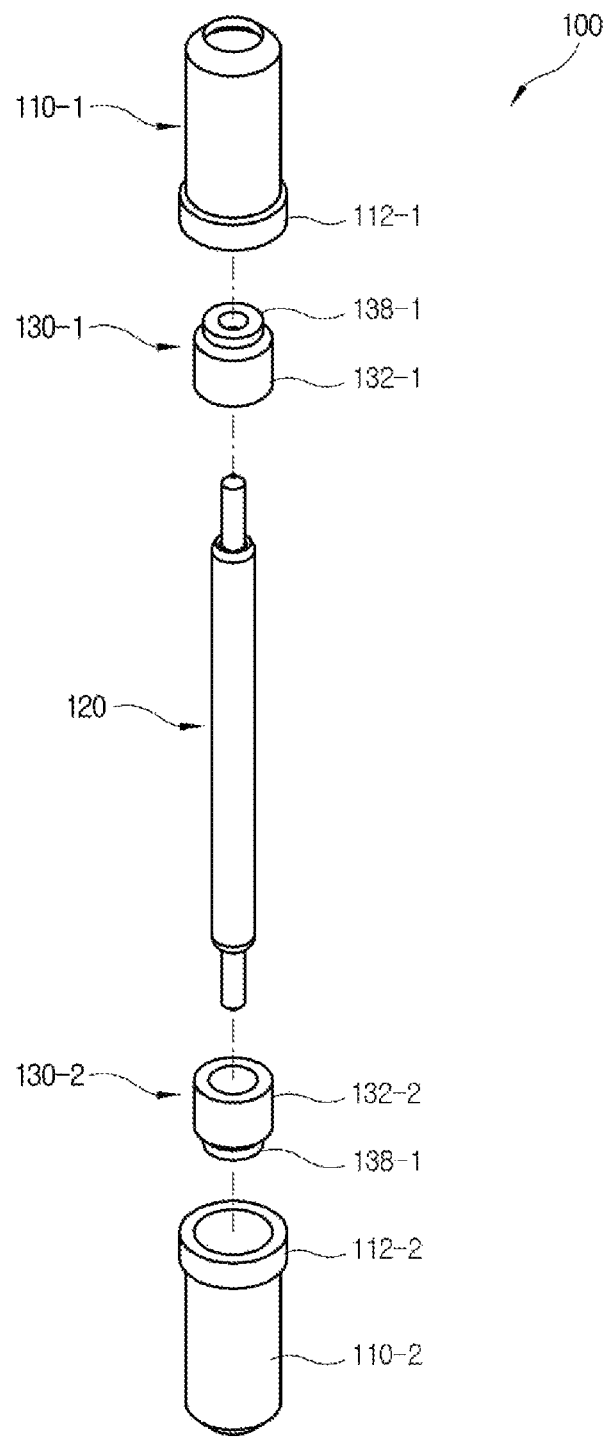
FIG. 12 is a partial cross-section view of a test socket to which the test probe assembly of FIG. 11 is applied.

FIG. 11 is an exploded perspective view of a test probe assembly according to a seventh embodiment of the present disclosure, and FIG. 12 is a partial cross-section view of a test socket to which the test probe assembly of FIG. 11 is applied.

As shown therein, the test probe assembly 100 includes a conductive first pipe 110-1, a conductive second pipe 110-2, a probe 120 retractable up and down as accommodated in the first and second pipes 110-1 and 110-2, and insulation first and second probe supporting members 130-1 and 130-2 for supporting the probe within the first and second pipes 110-1 and 110-2. In this test probe assembly 100, the probe 120 and the first and second probe supporting members 130-1 and 130-2 except the first and second pipes 110-1 and 110-2 have the same structure as the probe 120 and the first and second probe supporting members of the first embodiment shown in FIGS. 1 to 3, and thus repetitive descriptions thereof will be avoided.

The first pipe 110-1 includes a first flange 112-1 radially extended at one end portion thereof, and a first puckered portion 116-1 puckered toward the center at the other portion thereof. Substantially, the first puckered portion 116-1 is machined to have a predetermined curvature and thus form a first transaxial portion insertion hole 117-1 in which a first transaxial portion of the first probe supporting member 130-1 to be described later is inserted.

The second pipe 110-2 includes a second flange 112-2 radially extended at one end portion thereof, and a second puckered portion 116-1 puckered toward the center at the other end portion thereof. Substantially, the second puckered portion 116-2 is machined to have a predetermined curvature and thus form a second transaxial portion insertion hole 117-2 in which a second transaxial portion of the second probe supporting member 130-2 to be described later is inserted. The first flange 112-1 and the second flange 112-2 may be omitted.

The first pipe 110-1 and the second pipe 110-2 are configured to accommodate and support the probe 120 as the first flange 112-1 and the second flange 112-2 are connected to be in contact with each other.

The first and second probe supporting members 130-1 and 130-2 are configured to support the opposite end portions of the barrel 122 of the probe 120 to float between the connected first and second pipes 110-1 and 110-2.

The first and second probe supporting members 130-1 and 130-2 include the first and second barrel holes 131-1 and 131-2 corresponding to the outer diameter of the barrel 122 of the probe 120, and the first and second plunger holes 133-1 and 133-2 corresponding to the outer diameters of the first and second plungers 124 and 126, respectively.

The first and second probe supporting members 130-1 and 130-2 include first and second pipe insertion portions 132-1 and 132-2 to be inserted in the opposite end portions of the pipe 110, and first and second transaxial portions 138-1 and 138-2 radially reduced and extended from the first and second pipe insertion portions 132-1 and 132-2. The first and second transaxial portions 138-1 and 138-2 are inserted in the first and second transaxial portion insertion holes 117-1 and 117-2.

First and second stepped portions 119-1 and 119-2 are formed between the first and second pipe insertion portions 132-1 and 132-2 and the first and second transaxial portions 138-1 and 138-2 and correspond to the curvatures of the first and second puckered portions 116-1 and 116-2.

The first and second probe supporting members 130-1 and 130-2 are respectively inserted in the first and second barrel holes 131-1 and 131-2 at the end portions of the first and second flanges 112-1 and 112-2. Finally, the first and second probe supporting members 130-1 and 130-2 are not inserted any more since the first and second stepped portions 119-1 and 119-2 are stopped by the first and second puckered portions 116-1 and 116-2.

FIG. 12 illustrates a test socket 1 to which the test probe assembly 100 of FIG. 11 is mounted. As shown therein, the test socket 1 includes the conductive block 10 and at least one test probe assembly 100.

The conductive block 10 includes the first block 10-1 and the second block 10-2. As necessary, three or more conductive blocks 10 may be provided.

The first block 10-1 includes the first pipe hole 12-1 corresponding to the outer diameter of the first pipe 110-1, the first flange hole 13-1 corresponding to the first flange 112-1 of the first pipe 110-1, and a first plunger through hole. The first block 10-1 includes a first stepped portion 16-1 corresponding to the outer surface of the first puckered portion 116-1 of the first pipe 110-1 between the first pipe hole 12-1 and the first plunger through hole.

The second block 10-2 includes the second pipe hole 12-2 corresponding to the outer diameter of the second pipe 110-2, the second flange hole 13-2 corresponding to the second flange 112-2 of the second pipe 110-2, and a second plunger through hole. The second block 10-2 includes a second stepped portion 16-2 corresponding to the outer surface of the second puckered portion 116-2 of the second pipe 110-2 between the second pipe hole 12-2 and the second plunger through hole.

The first and second puckered portions 116-1 and 116-2 of the first and second pipe 110-1 and 110-2 are supported by the first and second stepped portions 16-1 and 16-2 of the first and second blocks 10-1 and 10-2 from the outside, and thus effectively prevented from being deformed by the first and second probe supporting members 130-1 and 130-2 at a test, thereby improving durability.

The test probe assembly and the test socket according to the present disclosure have advantages as follows.

First, the probe hole is covered with the metal pipe as much as possible, thereby minimizing exposure between the signal probes and improving noise-shield performance.

Second, only a damaged test probe assembly is replaceable in the test socket, thereby reducing repair costs.

Third, the probe supporting member is firmly supported in the metal pipe, thereby improving durability.

Fourth, it is easy to manufacture the test probe assembly for a shield against noise.

Although a few exemplary embodiments have been shown and described, it will be appreciated by those skilled in the art that changes may be made in these exemplary embodiments without departing from the principles and spirit of the invention.

Therefore, the scope of the present disclosure has to be not limited to the foregoing exemplary embodiments but defined in the appended claims and their equivalents.

A test probe assembly and a test socket according to the present invention may be applied to test a radio-frequency or high-speed semiconductor or the like object to be tested.

What is claimed is:

1. A test socket comprising:
at least one test probe assembly coupled to a conductive block,
wherein the test probe assembly comprises:
a conductive pipe formed of a conductive material and having an open upper end and an open lower end, the conductive pipe including a flange portion outwardly projected from a middle part of the conductive pipe;
a probe inserted in the pipe without contacting an inner surface of the conductive pipe, the probe including a plunger elastically retractable in a lengthwise direction of the conductive pipe; and
an insulation probe supporting member placed at each of the open upper and lower ends of the conductive pipe to support the probe between an inner wall of the conductive pipe and an outer surface of the probe,
wherein the insulation probe supporting member comprises a pipe insertion portion and an extended portion radially extended from the pipe insertion portion,
wherein an outer diameter of the extended portion of the insulation probe supporting member is the same as an outer diameter of the open upper and lower ends of the conductive pipe.

2. The test socket according to claim 1, wherein the probe supporting member is previously manufactured before to be inserted into the pipe.

3. The test socket according to claim 1, wherein the conductive pipe and the probe supporting member each comprises a projection or dent portion matching to each other for securely coupling the conductive pipe and the probe supporting member.

4. The test socket according to claim 1, wherein the probe supporting member is formed by injecting and hardening liquid epoxy in the pipe.

5. The test socket according to claim 1, wherein the conductive pipe comprises first and second pipes longitudinally connected to each other.

6. The test socket according to claim 3, wherein:
the probe comprises a barrel to which the plunger is inserted while partially protruding from the barrel, and
the probe supporting member comprises a barrel hole to accommodate the barrel and a plunger hole to accommodate the plunger.

7. The test socket according to claim 1, wherein the conductive block is configured to support a plurality of test probe assemblies in parallel so that both end portions of the probes can partially protrude from top and bottom surfaces of the conductive block.

8. A method of manufacturing a test probe assembly, the method comprising:
forming a projection, which protrudes inwardly by rolling or dimpling work, at one end portion of a conductive pipe;
mounting the conductive pipe to a tray;
inserting a mold having a shape similar to an outer appearance of a probe into one side of the conductive pipe;
covering the other side of the conductive pipe with a cover plate having a resin injection hole;
injecting resin through the resin injection hole and hardening the resin; and
removing the mold and the cover plate.

9. A test socket comprising:
at least one test probe assembly coupled to a conductive block,
wherein the test probe assembly comprises:
a conductive pipe formed of a conductive material and having an open upper end and an open lower end;
a probe inserted in the pipe without contacting an inner surface of the conductive pipe, the probe including a plunger elastically retractable in a lengthwise direction of the conductive pipe; and
an insulation probe supporting member placed at each of the open upper and lower ends of the conductive pipe to support the probe between an inner wall of the conductive pipe and an outer surface of the probe,
wherein the conductive pipe and the probe supporting member each comprises a projection or dent portion matching to each other for securely coupling the conductive pipe and the probe supporting member,
wherein the conductive block comprises a first conductive block and a second conductive block each having at least one probe hole formed there-through for receiving the test probe assembly, the first conductive block stacked on top of the second conductive block,
wherein the insulation probe supporting member comprises a pipe insertion portion, an extended portion radially extended from the pipe insertion portion, and a transaxial portion with a diameter reduced from the extended portion, wherein the first and second conductive blocks each includes a transaxial portion of reduced diameter formed at an entry side of the probe hole, the transaxial portion of the first and second conductive blocks having a shape corresponding to the transaxial portion of the insulation probe supporting member.

10. A test socket comprising:

at least one test probe assembly coupled to a conductive block, wherein the test probe assembly comprises:

a conductive pipe formed of a conductive material and having an open upper end and an open lower end, the conductive pipe including a flange portion outwardly projected from a middle part of the conductive pipe;

a probe inserted in the pipe without contacting an inner surface of the conductive pipe, the probe including a plunger elastically retractable in along a lengthwise direction of the conductive pipe; and an insulation probe supporting member placed at each of the open upper and lower ends of the conductive pipe to support the probe between an inner wall of the conductive pipe and an outer surface of the probe, wherein the conductive block comprises a first conductive block and a second conductive block each having at least one probe hole formed there-through for receiving the test probe assembly, the first conductive block stacked on top of the second conductive block, wherein the first conductive block includes a flange groove at a lower side of the block with its groove length corresponding to an upper half of the flange portion of the conductive pipe and the second conductive block includes a flange groove at an upper side of the block with its groove length corresponding to a lower half of the flange portion of the conductive pipe.

\* \* \* \* \*